United States Patent [19]

Hiraishi

[11] Patent Number: 5,785,757
[45] Date of Patent: Jul. 28, 1998

[54] APPARATUS FOR FABRICATING A SINGLE-CRYSTAL

[75] Inventor: Yoshinobu Hiraishi, Omura, Japan

[73] Assignee: Komatsu Electronic Metals Co., Ltd., Hiratsuka, Japan

[21] Appl. No.: 764,989

[22] Filed: Dec. 13, 1996

[30] Foreign Application Priority Data

Dec. 14, 1995 [JP] Japan ................................. 7-351098

[51] Int. Cl.$^6$ ..................................................... C30B 35/00
[52] U.S. Cl. ............................ 117/218; 117/208; 117/217; 117/222
[58] Field of Search ............................ 117/20, 34, 208, 117/217, 218, 222, 900

[56] References Cited

U.S. PATENT DOCUMENTS 3,261,671  7/1966  Jonge et al. ........................... 117/217
4,330,361  5/1982  Kuhn-Kuhvenfeld et al. .......... 117/217
4,358,416  11/1982  Yarwood et al. ...................... 117/217

Primary Examiner—Felisa Garrett
Attorney, Agent, or Firm—Varndell Legal Group

[57] ABSTRACT

The present invention provides a method and an apparatus for fabricating a single-crystal semiconductor by means of the CZ method in which the oxygen concentration in the single-crystal semiconductor is controlled within an acceptable range. The apparatus comprises a regulating cylinder concentrically covering the single-crystal semiconductor which is pulled from a melt in a crucible; a main chamber for isolating the growing single-crystal semiconductor from external atmosphere; and a falling gas introducing means on top of the main chamber for introducing an inert gas into the main chamber. The apparatus is characterized in that a whirling gas introducing means on a circumferential portion of the main chamber introduces an whirling inert gas into the main chamber in a tangential direction to the side walls of the main chamber and the regulating cylinder.

3 Claims, 6 Drawing Sheets

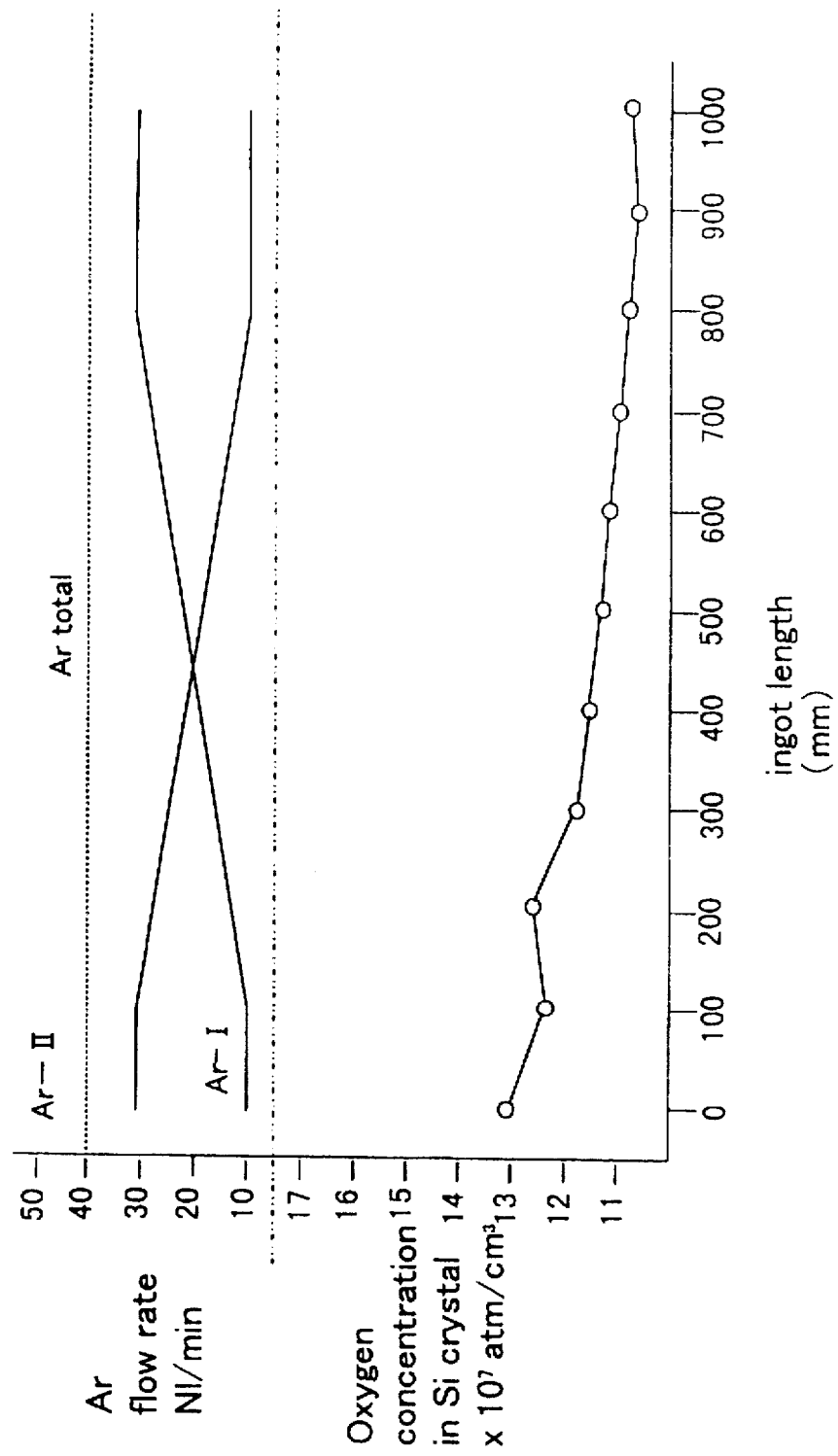

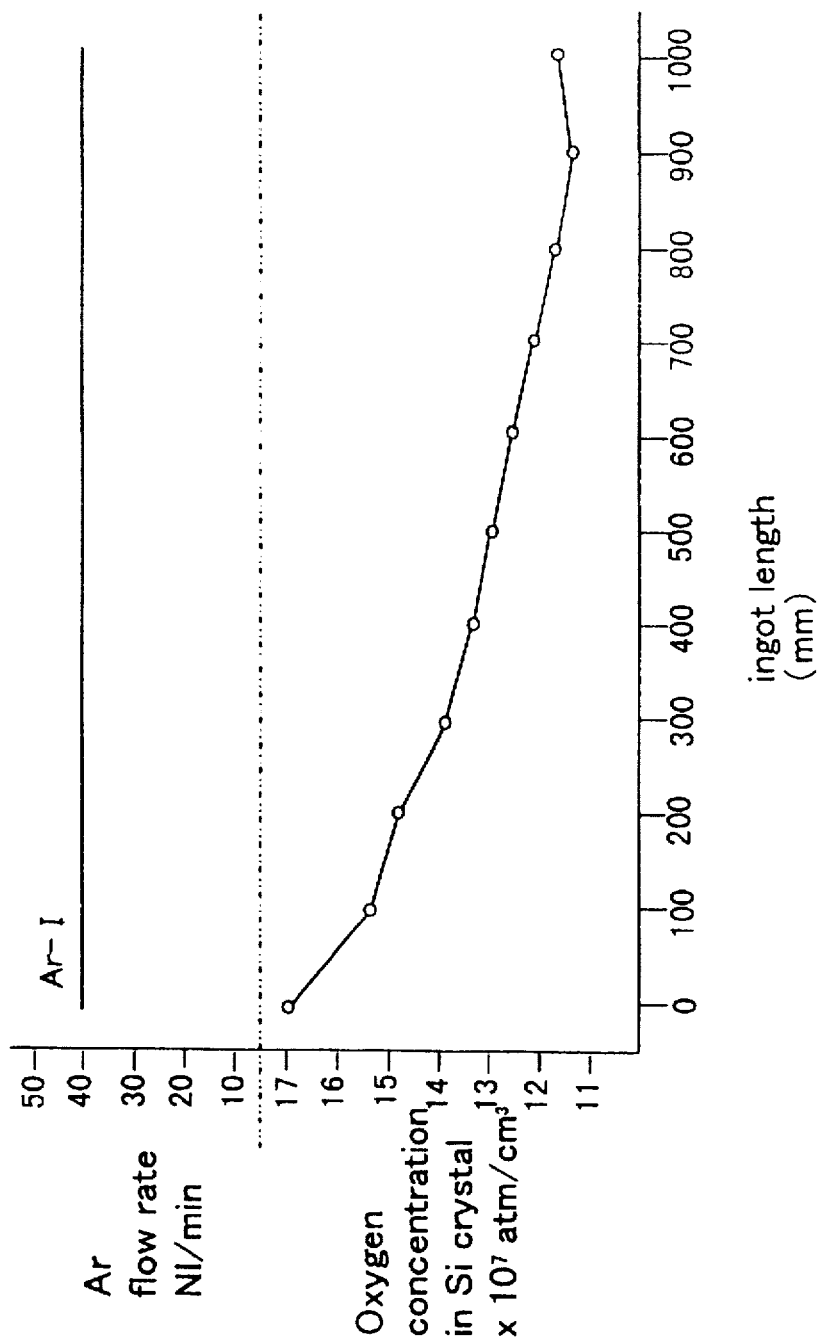

APPARATUS FOR FABRICATING A SINGLE-CRYSTAL

BACKGROUND OF THE INVENTION

1. Field of the Invention

The present invention relates to an apparatus for pulling a single-crystal semiconductor by means of Czochralski (CZ) method, and more specifically, to an apparatus and method for fabricating a single-crystal semiconductor in which the oxygen concentration is adjustable.

2. Description of Related Art

When the CZ method is employed to fabricate the single-crystal semiconductor, the oxygen concentration in the produced single-crystal semiconductor is known to be affected by average velocity of inert gas flow near the melt surface. For example, the flow rate of the gas does influence the concentration. Accordingly, in order to improve the productivity, the product by process of reaction, such as volatile silicon oxide, in pulling the single-crystal semiconductor from a melt in a quartz crucible must be removed effectively by a carrier gas. Therefore, as disclosed in Japanese Patent Application Laid-Open No. 5-254988, a conventional method for fabricating a single-crystal semiconductor introduces an inert gas inside a main chamber for fabricating the single-crystal semiconductor. The inert gas falls from the top of the main chamber, along the side wall of the main chamber and a melt surface of a crucible which is contained in the main chamber, and finally to the lower portion of the main chamber. The inert gas also cools the single-crystal semiconductor. Whereas those disclosed in Japanese Patent Application Laid-open No. 6-239692 include gradually expanding a carrier gas in the main chamber by the heat therein, blowing the carrier gas to whirl around the growing single-crystal semiconductor, and expelling volatilized products to the external of the crucible by means of the carrier gas reflected from the melt surface through the guide of regulating fins over the crucible. Besides, as disclosed in Japanese Patent Application Laid-open No. 6-56571, the space between the bottom of a thermal shelter and the melt surface is varied in a range of 10–40 mm. Moreover, the space between the melt surface and the bottom of a regulating cylinder which concentrically covers the single-crystal semiconductor is adjusted to control the flow rate of the inert gas flowing through the regulating cylinder, as is disclosed in Japanese Patent No. 3-122089.

However, in the conventional method and apparatus for fabricating a single-crystal semiconductor, such as those disclosed in Japanese Patent Application Laid-open No. 5-254988, the inert gas, such as Argon(hereafter Ar), does not whirl when it flows in the main chamber. Therefore, the flow rate of the gas is controlled by merely adjusting the melt amount and chamber pressure. Since there is a distance between the melt surface and the bottom (7) of the regulating cylinder, the gas flow rate near the melt surface cannot be precisely controlled. Especially when the single-crystal semiconductor is entering the bottom (7) of the regulating cylinder, the Ar gas flow will be enforced and a relatively fewer gas can reach the melt surface. The furnace disclosed in Japanese Patent Application Laid-open No. 6-239692 must have a specific outlet formed near the region where the temperature is more than 1000° C. (as the melting point of silicon is 1423° C.) . The outlet which has a complex structure is therefore difficult to be formed. Moreover, the shape of the outlet will disturb the gas flow so as to excite the melt and deposit amorphous silicon on the outlet. The amorphous silicon, when detaches from the outlet, will gather in the solid-liquid interface of the melt surface, thus affecting the growth of the single-crystal semiconductor. Since neither the apparatus disclosed in Japanese Patent Application Laid-open No. 6-56571 nor that of Japanese Patent Application Laid-open No. 3-122089 can control the radius component of the falling gas, the oxygen concentration cannot be controlled within an acceptable range.

SUMMARY OF THE INVENTION

Accordingly, the present invention provides a method and an apparatus for fabricating a single-crystal semiconductor by means of the CZ method in which the single-crystal pulling apparatus is capable of controlling the inert gas flow rate near the melt affects the oxygen concentration in the single-crystal silicon, thereby controlling the oxygen concentration in the single-crystal semiconductor within an acceptable range and producing high-quality single-crystal semiconductor.

The present invention provides a method for fabricating a single-crystal semiconductor by pulling the single-crystal semiconductor vertically upward from a melt in a crucible, and growing the single-crystal semiconductor inside a main chamber which is isolated from external atmosphere. The method is characterized in that the oxygen concentration in the single-crystal semiconductor is adjusted by controlling the flow rate ratio of a falling inert gas from upper portion of the main chamber and another whirling inert gas injected in tangential direction relative to a circumference of the main chamber.

The present invention provides an apparatus for fabricating a single-crystal semiconductor which comprises a regulating cylinder concentrically covering the single-crystal semiconductor which is pulled from a melt in a crucible; a main chamber for isolating the growing single-crystal semiconductor from external atmosphere; and a falling gas inlet on top of the main chamber for introducing an inert gas into the main chamber. The apparatus is characterized in that a whirling gas inlet on a circumferential portion side wall of the main chamber introduces an whirling inert gas into the main chamber in a tangential direction relative to circumferences of the main chamber and the regulating cylinder.

In an embodiment of the invention, the whirling gas inlet is an inlet opened along a tangential direction on a side wall of a cylindrical pulling chamber which is provided for cooling the pulled single-crystal semiconductor therein and which is connected to the top portion of the main chamber, thereby providing the inert gas into the main chamber.

In a preferred embodiment of the invention, the whirling gas inlet is an inlet opened along a tangential direction on top portion of the main chamber, thereby providing the inert gas into the main chamber.

The method and apparatus of the invention introduce the falling inert gas from the top of the cylindrical pulling chamber and the whirling inert gas from the side wall of the pulling chamber. The flow rate ratio of the two inert gases, under a constant total flow rate, is varied to generate an appropriate whirling velocity. The whirling velocity retains a constant near the melt surface where the single crystal grows. Therefore, the flow rate of the inert gas between the melt surface and the bottom of the regulating cylinder is determined by the synthetic velocity of the whirling velocity and the radius velocity determined by the total flow rate. Moreover, the oxygen concentration in the single-crystal semiconductor is controlled by regulating the synthetic velocity.

The present invention introduces the whirling gas in the main chamber without the conventional complex inlet. Since the flow rate ratio of the falling gas and the whirling gas is controlled, and the velocity of the inert gas flow, which is an important determinant to the oxygen concentration in the produced single crystal, is regulated independently from the furnace pressure, total gas flow rate, and the distance between the melt surface and the regulating cylinder (or thermal shelter), the oxygen concentration is controlled within an acceptable range.

BRIEF DESCRIPTION OF THE DRAWINGS

FIG. 4B is a view taken from the bottom of the regulating cylinder 14 in FIG. 4A;

FIG. 5 is a schematic diagram illustrating the relationship between the oxygen concentration and the flow rate ratio of the falling and whirling gases;

FIG. 6 illustrates the variation of the oxygen concentration along the crystallized axis according to the prior art.

DETAILED DESCRIPTION OF THE INVENTION

Figure 1:
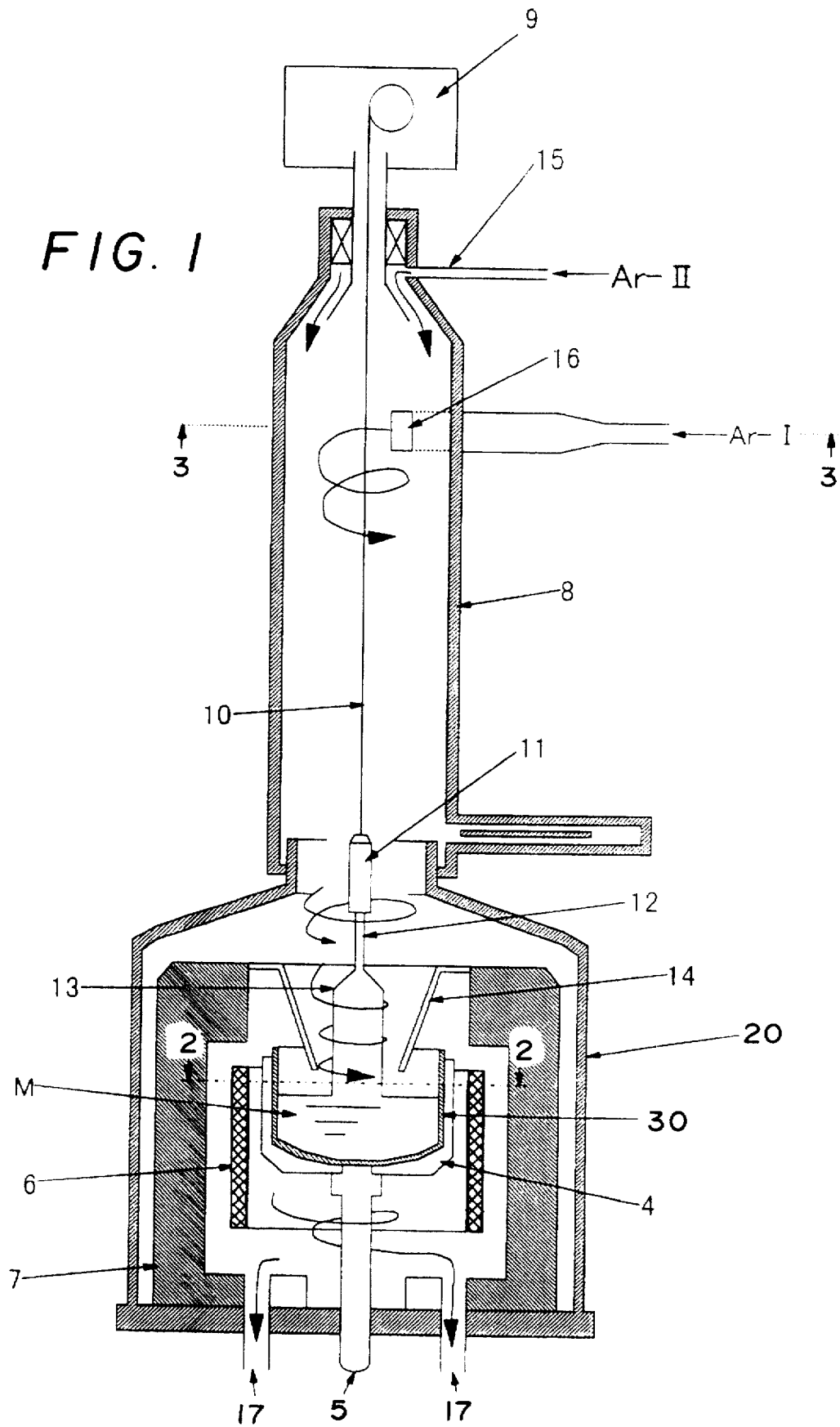
FIG. 1 is a cross-sectional view of the single-crystal semiconductor pulling apparatus according to an embodiment of the invention.

The embodiments of the present invention will be described in accompaniment with the drawings. The main body of a single-crystal pulling apparatus according to the CZ method is numerated as 1 in the figures. Referring to FIG. 1, in a cylindrical main chamber 20, a quartz crucible 30 is installed on a rotary elevator spindle 5 through graphite susceptor 4. Around the crucible 3 are heaters 6, such as electric heating wire heaters or high-frequency inductive coils, for controlling the temperature of the melt M. Insulators 7 made of, for example, graphite, are provided between the heater 6 and the main chamber 20. The melt M is formed by charging polysilicon material in the crucible 30 and melting by means of the heaters 6. In a small-dimensional cylindrical pulling chamber 8 which is in top of the main chamber 20, a silicon seed 12 is held by a seed holder 11 which is appended to the lower end of a pulling spindle 10 driven by an elevator motor 9 along the center axis of the main chamber 20. The seed 12 is immersed in the silicon melt M and is pulled up to grow the single crystal.

Figure 3:
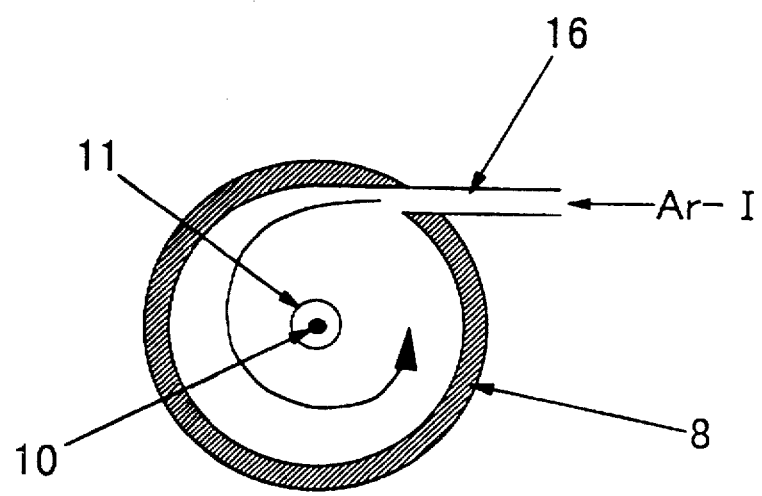
FIG. 3 is a cross-sectional view of the apparatus of FIG. 1 along the 3—3 line.

In an upper opening of the insulator 7, there is a regulating cylinder 14, which has a narrow lower end like a nozzle, concentrically covering the single-crystal semiconductor pulled from the melt M in the crucible 30. An inlet 15 for introducing a falling inert gas Ar-I is provided on top of the pulling chamber 8. A whirling inert gas introducing means 16 for providing a whirling inert gas Ar-II is located below the inlet 15 in the pulling chamber 8. The whirling inert gas inlet, as shown in FIG. 3, is an inlet opened along the tangential direction of the cylinder wall for the entrance of the whirling gas Ar-II. The whirling gas Ar-II, with a component along the tangential direction of the walls of the regulating cylinder 14 and the main chamber 20, flows through the pulling chamber 8 to the regulating cylinder 14 and main chamber 20. An outlet 17 is formed on the bottom of the main chamber 20 for expelling the Ar gas.

Figure 2:
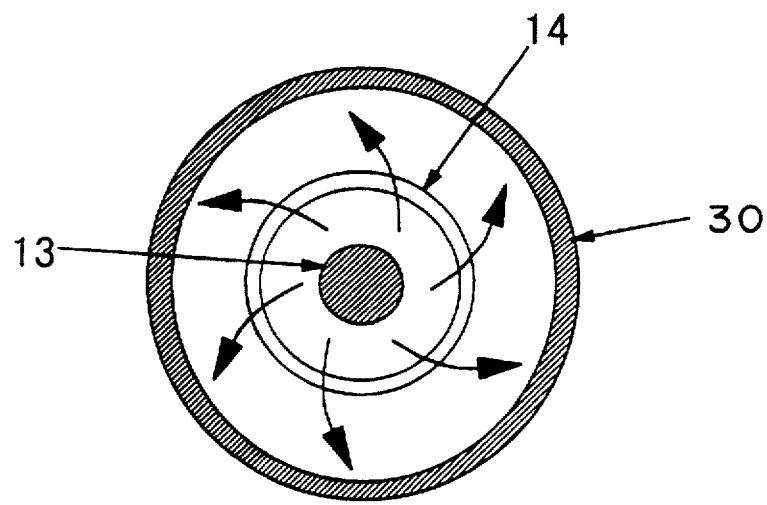
FIG. 2 is a cross-sectional view of the apparatus of FIG. 1 along the 2—2 line.
Figure 4A:
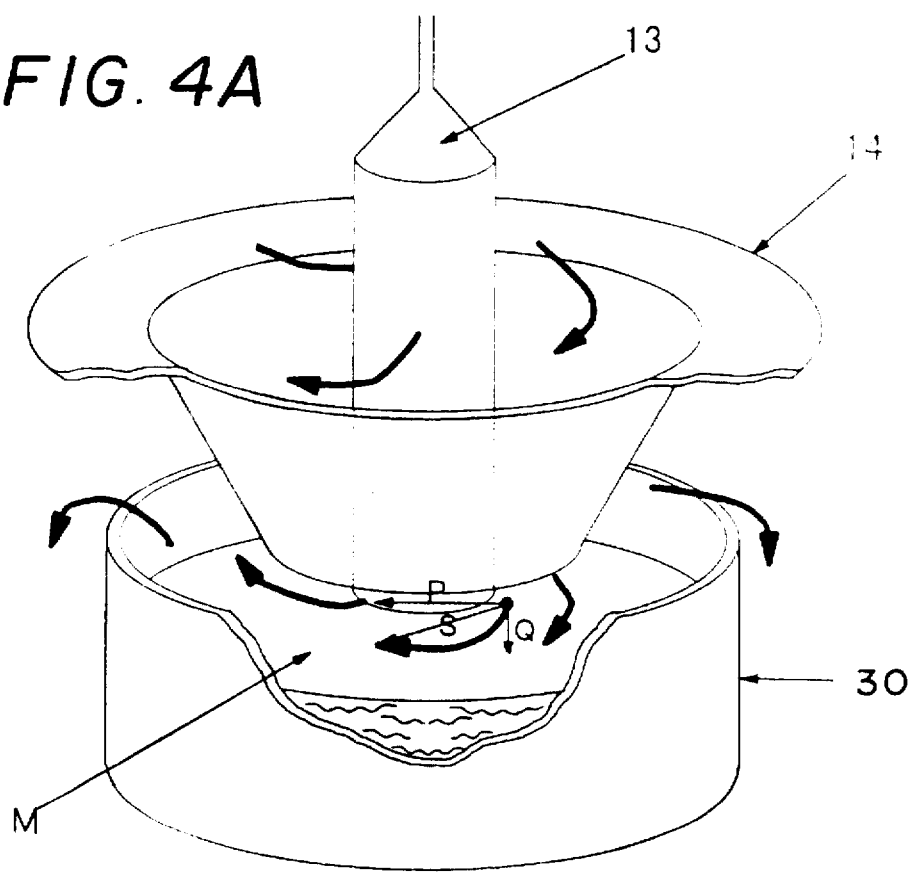
FIGS. 4A and 4B are schematic diagrams illustrating the synthetic principle of the velocity of the inert gas flow at the lower portion of the regulating cylinder 14, where
Figure 4B:
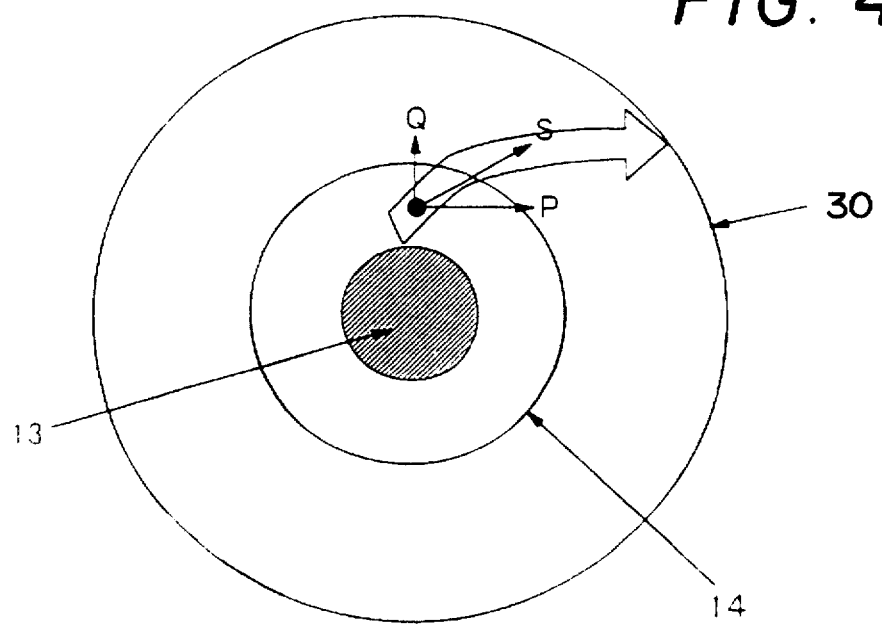

By the introduction of the falling inert gas from the top of the pulling chamber and added whirling inertgas along the tangential direction of the circumference of pulling chamber 8, various whirling velocities can be obtained by changing the flow rate ratio, whereas the total flow rate of the inert gas retains a constant. Referring to FIG. 2, whirling of the inert gas flow is remained to the melt surface where single crystal is growing. Therefore, referring to FIGS. 4A and 4B whirling inert gas between the melt surface and the bottom of the regulating cylinder has a flow velocity vector S synthesized by whirling velocity vector P and a radial velocity vector Q determined by total flow rate. The synthesized flow remains in whirling and layered flow state. When the single-crystal semiconductor grows, the oxygen concentration therein can be controlled by regulating the synthetic velocity.

Figure 7:
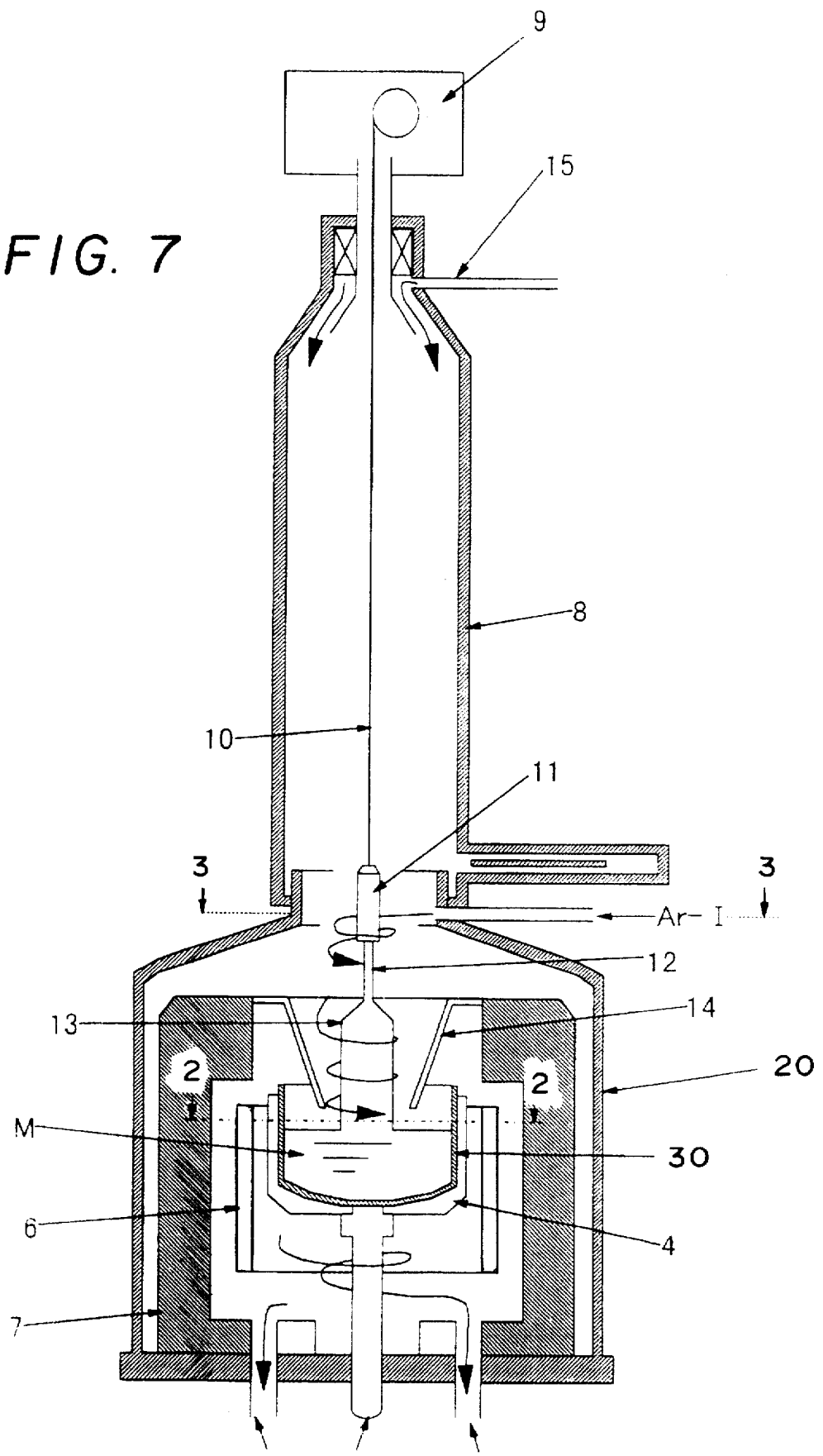
FIG. 7 is a cross-sectional view of the single-crystal pulling apparatus according to a second embodiment of the invention.

Moreover, as another embodiment the whirling gas inlet can be an Ar-II gas inlet formed along the tangential direction of the circumference on the top of the main chamber 20, as shown in FIG. 7. Furthermore other whirling gas inlets formed in the main chamber can attain the similar function. Since the present invention has no limitation to the formation of the gas inlet, they can be amended as desired.

Furthermore, the oxygen concentration in the single-crystal semiconductor can be well controlled under the following preferred conditions. 60 kg of polysilicon material is charged in a quartz crucible 30 whose inner diameter is about 440 mm. The polysilicon is melted as the pressure inside the main chamber 26 is about 20 Torr. The crucible 30 rotates at a rate of about 5 rpm. The single crystal grows as it rotates at a rate of about 15 rpm and is pulled at a speed of 1.0 mm/min. The distance from the melt surface and the bottom of the regulating cylinder is about 30 mm. The variation of oxygen concentration along the pulling direction of a single crystal fabricated by mere the conventional Ar-I gas supply is illustrated in FIG. 6. The oxygen concentration is very high and non-uniformly distributed along the axis. On the contrary, in the present invention, both the direct Ar-I gas and the whirling Ar-II gas are utilized and their flow rate ratio is adjusted to control the oxygen concentration. Referring to FIG. 5, the total oxygen concentration is reduced and the distribution is uniform along the axis due to the introduction of the whirling Ar-II gas. The improvement is a result of substantially higher Ar gas velocity near the melt surface when the whirling gas appears. The aforementioned Japanese Patent Application Laid-Open No. 6-56571 discloses that a higher Ar velocity increases the oxygen concentration, whereas Patent Application Laid-Open No. 3-122089 tells that the oxygen concentration is reduced as the Ar velocity increases. The contradictory results are explainable since a solid silicon layer exists in the crucible of Patent Application Laid-Open No. 6-56571.

What is claimed is:

1. An apparatus for fabricating a single-crystal semiconductor, comprising
  a regulating cylinder concentrically covering the single-crystal semiconductor which is pulled in a vertical upward direction from a melt in a crucible;
  a main chamber for isolating the growing single-crystal semiconductor from external atmosphere;
  a falling gas introducing means on top of the main chamber for introducing an inert gas into the main chamber; and a whirling gas introducing means on a circumferential portion of the main chamber for introducing an whirling inert gas into the main chamber in a tangential direction relative to circumference of the main chamber.

2. The apparatus as claimed in claim 1, wherein the whirling gas inlet is an inlet opened along a tangential direction on a side wall of upper portion of a cylindrical pulling chamber which is provided for cooling the pulled single-crystal semiconductor therein and which is connected to the top portion of the main chamber, thereby providing the inert gas into the main chamber.

3. The apparatus as claimed in claim 1, wherein the whirling gas inlet is an inlet opened along a tangential direction on the top portion of the main chamber, thereby providing the inert gas into the main chamber.

* * * * *